United States Patent [19]
Cox et al.

[11] Patent Number: 5,754,440
[45] Date of Patent: May 19, 1998

[54] APPARATUS FOR HARMONIC ANALYSIS OF WAVEFORMS IN AN AC ELECTRICAL SYSTEM

[75] Inventors: Roger W. Cox, Oakdale; Robert T. Elms, Monroeville, both of Pa.

[73] Assignee: Eaton Corporation, Cleveland, Ohio

[21] Appl. No.: 608,386

[22] Filed: Feb. 28, 1996

[51] Int. Cl.⁶ .................................................. H02J 3/01
[52] U.S. Cl. .......................... 364/487; 364/481; 364/484; 364/485; 361/85
[58] Field of Search ........................ 361/85; 324/76.11, 324/76.12, 76.15, 76.19, 76.21, 76.24, 76.28, 76.29, 76.39, 76.41, 76.42, 76.47, 76.55, 76.58, 76.77, 76.82, 623, 140 R, 140 D; 340/660, 658; 307/105; 364/480–487, 492, 572, 576

[56] References Cited

U.S. PATENT DOCUMENTS

| | | | |
|---|---|---|---|
| 4,672,555 | 6/1987 | Hart et al. | 364/483 |
| 4,695,792 | 9/1987 | Roy | 324/76.82 |
| 4,818,947 | 4/1989 | Zucker et al. | 324/623 |
| 4,901,244 | 2/1990 | Szeto | 324/76.21 |
| 5,224,054 | 6/1993 | Wallis | 364/483 |
| 5,233,538 | 8/1993 | Wallis | 364/483 |
| 5,343,404 | 8/1994 | Girgis | 364/484 |
| 5,499,155 | 3/1996 | Gershen et al. | 361/85 |
| 5,539,651 | 7/1996 | Zabar et al. | 324/623 |
| 5,567,994 | 10/1996 | Davis et al. | 307/105 |

*Primary Examiner*—Emanuel T. Voeltz
*Assistant Examiner*—Hal P. Wachsman
*Attorney, Agent, or Firm*—Martin J. Moran

[57] ABSTRACT

A monitor for an ac electrical system generates on-line a display presenting the values, either in magnitude or as a percent of the fundamental, of 50 harmonics of any of the currents and voltages in the system. The display also incudes the phase angle of each harmonic relative to a reference waveform, which is preferably phase A-B voltage or phase A to neutral voltage.

2 Claims, 5 Drawing Sheets

```
    VAB= 483.1
    VBC= 476.9
    VCA= 475.8
       VOLTS
TRND  EVNT  HARM  DEMD
```

```
/HARMONIC/VOLTS/VAB
  #    VOLTS    PH.ANGLE
  1    433.4      0.0
  2      0.8   -154.5
  3      0.8    128.8
  4      0.8     52.1
  5     40.2     69.6
FIRST  PGUP  PGDWN  LAST
```

APPARATUS FOR HARMONIC ANALYSIS OF WAVEFORMS IN AN AC ELECTRICAL SYSTEM

BACKGROUND OF THE INVENTION

1. Field of the Invention

This invention relates to apparatus for monitoring waveforms in ac electrical systems and particularly for performing harmonic analysis of the waveforms. More specifically, it relates to such apparatus, which provides a visual representation of the harmonics, which includes a measure of the phase angle of each harmonic relative to a selected reference waveform.

2. Background Information

Historically, apparatus for monitoring ac electrical systems have performed metering functions. State of the art monitors utilizes microcomputers, which perform these functions digitally. It has only been recently that the performance of these microcomputers has been adequate that they can perform on-line harmonic analysis of waveforms in the ac electrical system in addition to performing the metering functions. Initially the digital monitors captured the waveforms for off-line harmonic analysis by a separate computer. This was due to the very high processing burden that harmonic analysis places on the microcomputer. Still, there is room for improvement in monitors for ac electrical systems that provide harmonic analysis.

In particular, there is a need for such apparatus that provides improved presentation of the harmonic analysis to the user.

There is also a need to provide additional analysis of the phase angles between the harmonics.

There is a related need for such apparatus that takes into account frequency dependent phase shifts introduced by filters provided in the inputs of such apparatus.

SUMMARY OF THE INVENTION

These needs and others are satisfied by the invention, which is directed to apparatus for on-line harmonic analysis of the waveforms in an ac electrical system, which includes processing means, which not only determines values of each of the harmonic values, either magnitude or percent of the fundamental, but also determines the phase angle of each of the harmonics relative to a reference waveform. The harmonic value and the phase angle are presented, preferably on a visual display device. The reference waveform is one of the waveforms in the ac electrical system, preferably a voltage waveform. This voltage waveform can be either a line-to-neutral or a line-to-line voltage.

As another aspect of the invention, the apparatus includes input filtering in the form of a low pass filter, which removes spikes from the waveforms. This filtering causes a phase shift, which is dependent upon frequency, so that the higher harmonics are shifted a greater number of degrees. We have found that this phase shift with frequency is essentially linear so that the shift for a particular harmonic can be determined by multiplying the number of the harmonic by the slope of the linear function.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
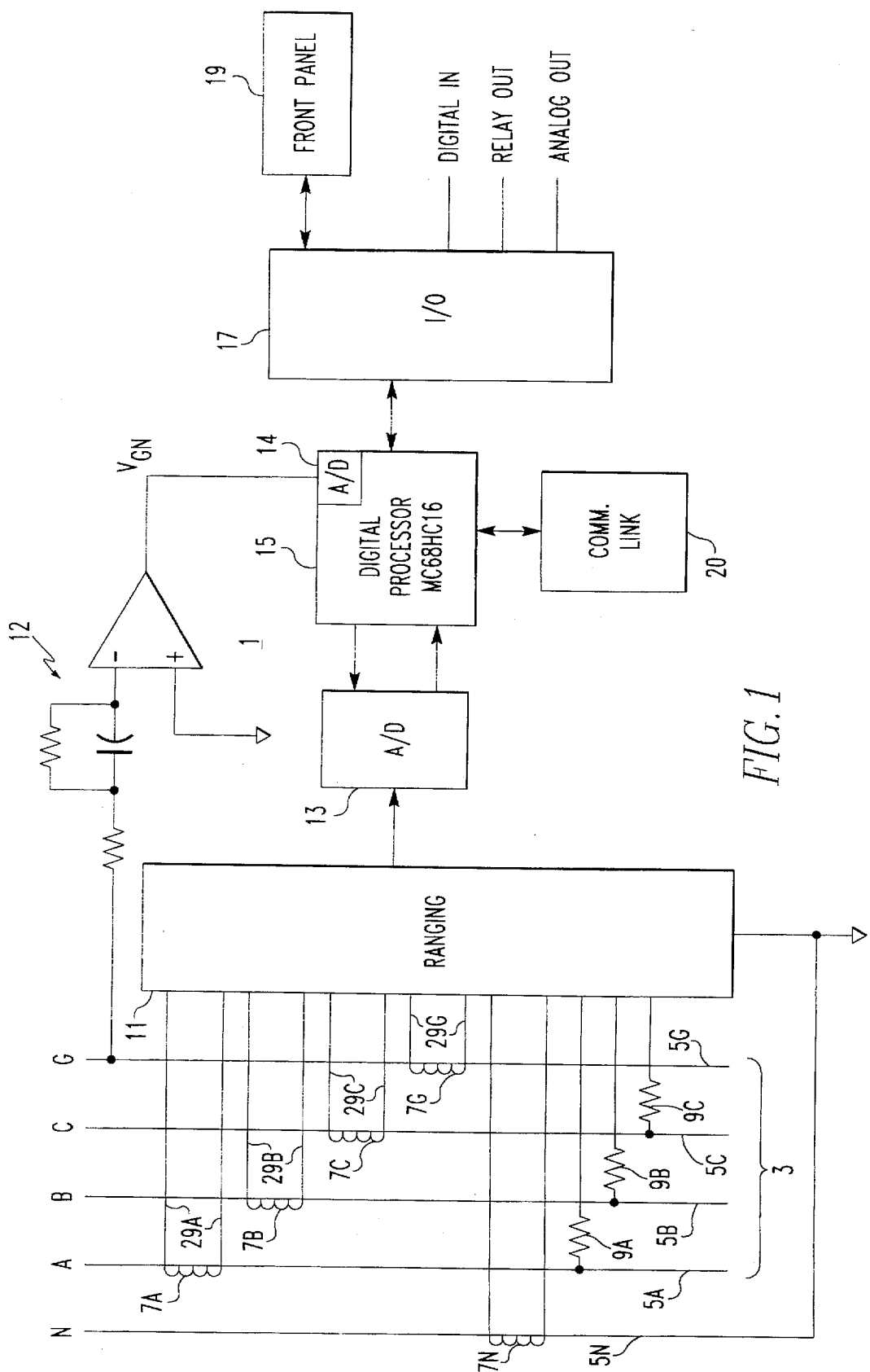
FIG. 1 is a schematic diagram, primarily in block form, of a monitor in accordance with the invention.

Referring to FIG. 1, the analyzer/monitor 1 of the invention is used to monitor and analyze an electric power system 3 such as a power distribution system. The power distribution system 3 illustrated has three phase conductors 7A, B and C, a neutral conductor 5N and a ground conductor 5G. Current transformers 5A, B, C, G and N sense current flowing in each of these conductors while phase-to-neutral voltages are sensed by the sensing resistors 9A, B and C. A ranging/filter circuit 11 converts the current and voltage waveforms from −10 to 0 to +10 volt signals for conversion by analog-to-digital (A/D) converter 13 for input to a digital processor 15. It also provides low pass filtering to remove noise spikes from the sensed waveforms. The A/D converter 13 samples the analog voltages and currents at intervals determined by interrupts generated by a digital processor 15. These interrupts are generated selectively at a first, slow speed sampling rate, or a second, high speed sampling rate. During low speed sampling, the A/D converter 13 samples all 5 currents and all 3 voltages. For high speed sampling, again all currents and the three-phase voltages are digitized for input to the processor. Each of these currents and voltages is sampled on each interrupt. The ground to neutral voltage $V_{GN}$ is amplified by an input circuit 12, which includes filtering and is converted to digital samples by an analog-to-digital (A/D) converter 14 in the digital processor 15.

The digital processor 15 utilizes the digital samples to generate values of two sets of electrical parameters. The first set of parameters is related to the monitoring function and includes metered parameters such as: rms currents and voltages, peak currents and voltages, minimum currents and voltages, power factor, watts, Vars, volt-amps, total harmonic distortion, K-factor, CBEMA derating factor and the like. The second set of parameters calculated by the digital processor 15 comprises the individual harmonic coefficients. Data collection and processing are organized in the manner described in U.S. patent application Ser. No. 08/325,711 filed on Oct. 17, 1994, now U.S. Pat. No. 5,587,917, so that a maximum number of parameters can be monitored continuously while also providing the capability for simultaneous calculation of harmonic content.

The digital processor 15 has an input/output (I/O) 17 through which the processor 15 is connected to a front panel 19. The front panel 19 serves as an interface with the user. It is through the front panel that the user can control the operation of the analyzer/monitor 1 and monitor the ac electrical power system 3. The input/output device 17 also interfaces the digital processor 15 with contact inputs through digital inputs. Relay outputs and analog outputs are also provided through the input/output device 17. The digital processor 15 can also communicate with a remote processor through a communications link 20. Through this communications link 20, the analyzer/monitor 1 can provide information to and/or be controlled by a remote processor (not shown).

The digital processor 15 generates the interrupts at a slow rate for monitoring and at a faster rate for data capture in order to control the burden on the processor so that all of the required functions can be performed. The sampling scheme used by the digital processor 15 is the same as that described in U.S. Pat. No. 5,587,917. As is known, waveform capture requires synchronous sampling at a rate that is at least twice that of the highest harmonic to be extracted. The monitoring functions, on the other hand, do not require synchronous sampling. Hence, the technique known as equivalent sampling is used for the slow speed sampling in order to increase the effective sampling rate. In the equivalent sampling technique, the ac waveforms are sampled a selected number of times per cycle with a delay of a fraction of a cycle before another cycle of samples is taken at the same sampling rate. Thus, the sampling instants are "bumped" each cycle by the selected fraction of a cycle. The data collected over a number of such "bumped" cycles are then used to calculate the various parameters.

Equivalent sampling at low speed with selectable high speed sampling for waveform capture is implemented by sampling in frames. Each sampling frame comprises a number of repetitions of sampling for a selected number of cycles followed by a delay, which is a fraction of a cycle. In the exemplary system, the selected number of cycles is two and the frame constitutes four repetitions of sampling of two cycles each followed by a delay $\delta$. Thus, the exemplary frame is equal to eight cycles plus 4$\delta$. The slow speed sampling rate is 32 samples per cycle and $\delta$ is made equal to $\frac{1}{128}$ of a cycle so that the sampling frame is equal to 8 $\frac{1}{32}$ cycles of the fundamental frequency of the waveforms. This provides an equivalent sampling rate of 128 samples per cycle.

High speed sampling can be implemented in any one of the repetitions, but only one, during a sampling frame. Thus, for instance in the exemplary system, high speed sampling, when called for, is implemented in the third repetition within the frame. Any one of the frames can be used for high speed sampling, but it is always the same repetition within the frame. Since high speed sampling is performed for only one repetition, the sampling can be synchronous, a requirement for Fourier analysis of the harmonic content of the waveform. By synchronous, it is meant that an integer number of samples are taken per cycle. As the delay, $\delta$, comes at the end of the repetition, it does not disturb the synchronous sampling performed during only one repetition. The high speed sampling is carried out at a rate, which is an integer multiple of the slow speed rate. In the exemplary embodiment, the high speed rate is 128 samples per cycle, which is four times the slow speed rate. This permits the slow speed data to be extracted from the high speed data, so that continuous data is available for the calculations performed during the slow speed sampling.

While the selected number of cycles in each repetition is two in the example, other numbers of cycles can be used. However, the number of cycles selected for each repetition sets the maximum number of cycles of high speed data that can be collected during a frame.

Sampling at the high speed rate for waveform capture can be implemented automatically in response to conditions in the ac electrical power distribution system 3, such as for instance, an overcurrent condition, a trip, a low voltage condition, or the like. In addition, high speed sampling can be commanded through the front panel 19 or remotely through the communications link 20. Also, high speed sampling can be initiated by a timer (not shown).

Figure 2:
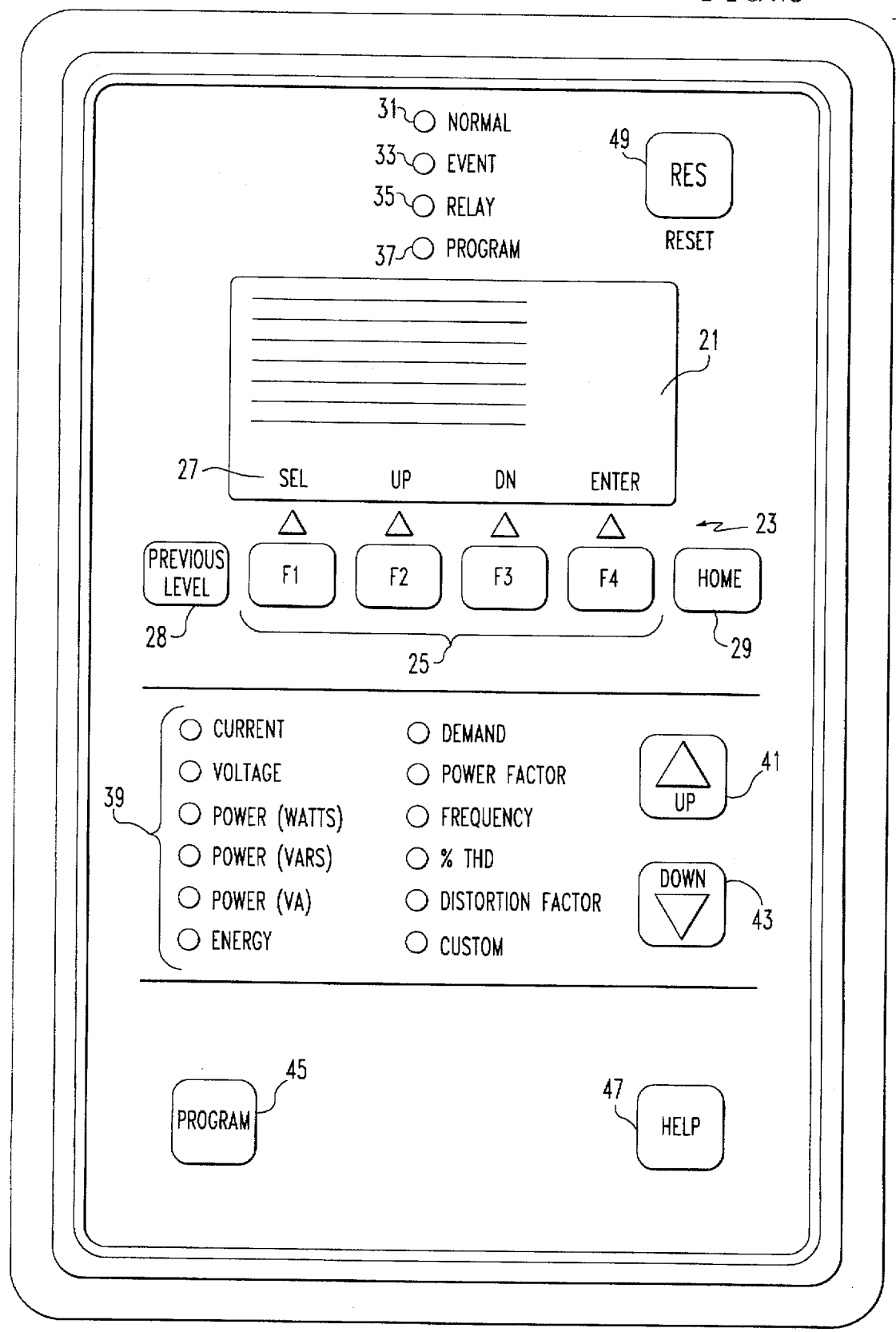
FIG. 2 is an elevation view of a front panel forming part of the monitor of FIG. 1.

FIG. 2 is an illustration of the front panel 19, which forms the user interface. A major feature of the front panel 19 is a display 21, which in the exemplary embodiment of the invention is an eight line gas plasma display. Preferably, the user interface is in the form of soft keys 23 presented on the display 21. The user makes a selection by touching an appropriate one of a number of switches 25 labeled F1–F4 located on the front panel adjacent the display 21. The functions of the switches 25 are indicated by the soft switch icons 27 presented on the display and can change from screen to screen. Other types of user interface devices 23 can be used such as a keyboard, mouse or track ball. A meter menu is presented on the display 21 for use by the operator in selecting the parameters of interest from the large number of parameters generated by the device. Additional switches 28 labeled PREVIOUS LEVEL and 29 labeled HOME allow the operator easily to move through the menus.

The gas plasma display 21 can provide up to 8 lines of information with the bottom line being used for the soft key icons 27. In some modes, two lines can be used to provide larger, high visibility characters.

The front panel 19 includes a number of light emitting diodes (LEDs) to indicate a number of functions, operations and/or events. Four LEDs at the top of the front panel 19 provide a quick snapshot of the unit's status. A normal LED 31 blinks green to indicate power to the unit, normal system operation and that all the hardware is operational. The LED 31 is not lighted if there is a malfunction. An EVENT LED 33 lights to indicate that an event has occurred, such as a parameter has exceeded the selected threshold. A RELAY LED 35 illuminates to indicate that one of the relays has become active. The PROGRAM LED 37 lights to indicate that the program mode has been selected and that program screens are displayed on the display 21.

The front panel 19 includes 12 additional LEDs 39. As mentioned, the monitor 1 tracks a large number of electrical parameters, 60 in the exemplary monitor. Obviously, since the display 21 can present only seven lines of characters at a time, the values of all of these parameters cannot be presented simultaneously. However, the parameters are grouped by type and the LEDs 39 indicate the type of parameters being presented on the display.

Figures 3, 4, 5:
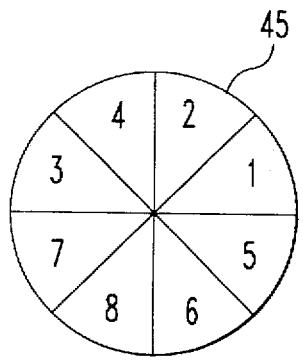
FIG. 3 illustrates a display generated on the front panel of the apparatus.
FIG. 4 is a diagram illustrating division of the real and imaginary plane used to depict the components of the harmonics into octants.
FIG. 5 illustrates a display screen generated by the monitor to display harmonic values including phase angle.

Thus, by using the UP and DOWN push buttons 41, 43, the operator can select the group of parameters to be displayed. Thus, for instance, by using the buttons 41, 43, the voltages can be presented on the display 21, which will be indicated by illumination of the VOLTAGE LED 39. An example of a voltage screen on the display 21 is shown in FIG. 3. On this screen the line-to-line voltages are displayed double size, that is, using two lines each of the display. The seventh line indicates that the parameters are being displayed in volts and the bottom line represents the soft keys, which in this case, are labeled TRND for trend, EVNT for event, HARM for harmonics and DEMD for demand. By use of the appropriate soft key, the operator can obtain more information about the displayed parameters. For instance, selecting trend analysis generates a display showing time and date stamped minimum and maximum values for the selected parameters. Event analysis provides a description, day and time of occurrence and other values related to events. Events occur when a parameter exceeds a programmed threshold value. Demand analysis provides present and peak currents and power. Pressing the HARM soft key initiates harmonic analysis, which begins with sampling of all of the currents and voltages at the fast sampling rate. The magnitude, either in volts or as a percentage of the fundamental, is then calculated for each harmonic together with the phase angle between the harmonic and a reference waveform. The default reference waveform is the phase A to B line-to-line voltage, unless line to neutral voltages have been selected for display, in which case the referenced waveform is the phase A to neutral voltage. These values are generated for fifty harmonics for each of the five currents Ia, Ib, Ic, In, Ig, or one of three line-to-line voltages, Vab, Vbc, Vca, or one of three line-to-neutral voltages, Van, Vbn, Vcn. This is accomplished by a Fourier algorithm, which determines a sine and cosine value for each harmonic as follows:

$$F\text{sine}(n) = \frac{2}{K+1} * \sum_{j=0}^{j=K} \{\sin[n*w*j*T1]*x(j)\} \quad \text{Eq. 1}$$

$$F\text{cosine}(n) = \frac{2}{K+1} * \sum_{j=K}^{j=0} \{\cos[n*w*j*T1]*x(j)\} \quad \text{Eq. 2}$$

Where n=harmonic number, w=2*PI*fundamental Hertz, j=the number of samples and T=the period between samples. The sign and cosine values determined from Equations 1 and 2 are the real and imaginary components of each of the fifty harmonics. The first harmonic for Vab (or Van if the most recently selected voltage is line-to-neutral) establishes the reference angle for determining the phase angles of the remaining harmonics. While the reference voltage was collected at some arbitrary phase angle, that angle becomes the reference for all of the other waveforms. The phase is the arctan of the imaginary/real. A look-up table of arctan values for determining the phase angle is stored in the processor. As the arctan becomes very large in value and approaches infinity at 90°, the phase angle in accordance with the invention is determined in 45° increments. This technique is illustrated by FIG. 4, in which the real and imaginary plane is divided into eight sectors or octants 45 so that there are 45° in each sector for a total of 360°. In determining the actual phase angle, if the real component is positive, the phase is in one of the sectors 1, 2, 5, or 6. Then, if the imaginary component is also positive, the phase angle can be narrowed to the octants 1, or 2 (5 or 6 if the imaginary component is negative). Conversely, if the real component is negative, the phase angle is in sections 3, 4, 7, or 8 and if the imaginary component is positive, the field is narrowed to sectors 3 or 4 (7 or 8 if the imaginary component is negative).

In order to limit the measurement to angles of 45° of less, the larger of the real and imaginary components is always made the denominator so that the value of the arctan is 1 (for 45°) or less. In determining, in which of the two sectors in each quadrant the phase angle lies, if the real component is equal to or larger than the imaginary component, then the angle lies in the lowered number of the two sectors. For example, if both the real and the imaginary components are positive, the angle lies in the octant 1 if the real component is larger than the imaginary component, or in octant 2 if the imaginary component is larger than the real component. In order to provide a resolution of better than 0.2° in the phase angle, there are 320 entries in the 45° table.

Once the angle is determined from the table, appropriate rotation must be applied for the octant, in which the angle lies. The following is a table indicating the rotation to be applied to the angle returned by the 45° look-up table to determine the actual angle.

| OCTANT | ROTATION NEEDED |
| --- | --- |
| 1 | The table value is correct. |
| 2 | 90 minus the table value. |
| 3 | 180 minus the table value. |
| 4 | 90 plus the table value. |
| 5 | Negative of the table value. |
| 6 | 90 plus the table value. |
| 7 | 180 plus the table value. |
| 8 | 90 minus the table value. |

As mentioned, the phase angle routine returns the correct angle in tenths of degrees. All return values are from −180.0° to +180.0°.

As mentioned, the analog signals generated by the current transformers 7 and the sensing resistors 9 are filtered by a low pass filter in the ranging and filter circuit 11 to remove spikes. This filtering causes a phase shift in the sensed signals, which is frequency dependent. It turns out that this frequency dependency is essentially linear. Thus, the adjustment that must be made to the phase angle for each of the harmonics as determined by the following relationship:

$$\text{adjustment} = \frac{100 * \text{system frequency} * \text{harmonic number} - 1}{\text{filter constant}} \quad \text{Eq. 3}$$

The filter constant in equation 3 is the slope of the essentially linear function. Thus, this filter constant can be determined by empirically determining a phase shift for the fundamental and the 50 harmonic. In the illustrative monitor, this filter constant was 2.7° per harmonic.

An example of a display screen generated in accordance with the invention is shown in FIG. 5 for the phase ab in voltage. In this example, the magnitude and phase angle of the first 50 harmonics of Vab is shown. As previously mentioned, the display 21 only has eight lines. The top line indicates the parameter being displayed, in this case the harmonics of Vab. The second line of the display identifies the values presented on the next five lines. The particular screen illustrated shows the fundamental (the first harmonic) through the fifth harmonic. As will be noted, since Vab is used as the reference for determining the phase angles, the phase angle of the first harmonic displayed is 0°. The bottom, or eighth line of the display provides the icons 27 for the soft keys 23. In this case the soft keys are FIRST, PGUP, PGDWN and LAST. These soft keys permit the user to page down through the other harmonics of the displayed parameter. Since 50 harmonics are displayed, there are 10 pages that can be presented on the screen. The FIRST and LAST soft keys allow the operator to jump to the first or last screen quickly.

Figure 6A:
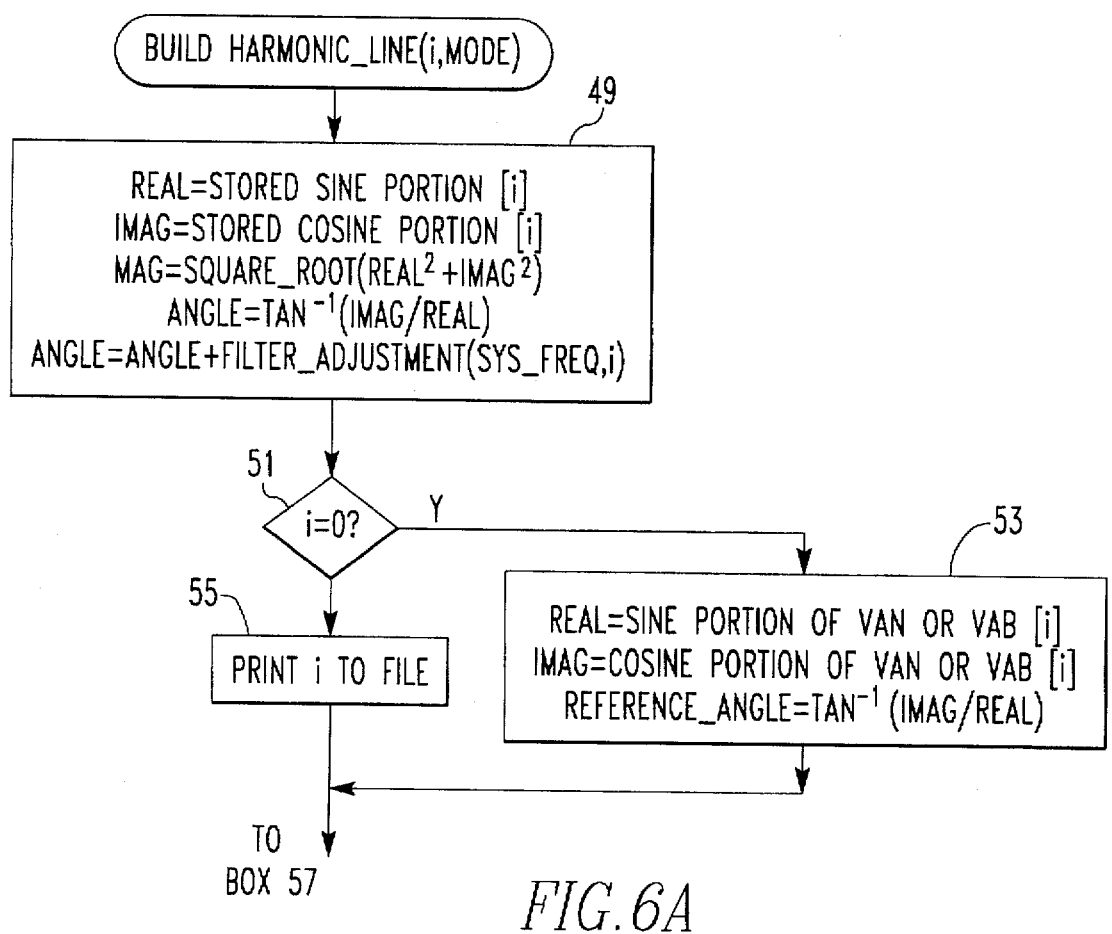
FIGS. 6A and 6B illustrate a flow chart of a routine used by the apparatus of the invention to generate the harmonic display including the phase angle.
Figure 6B:
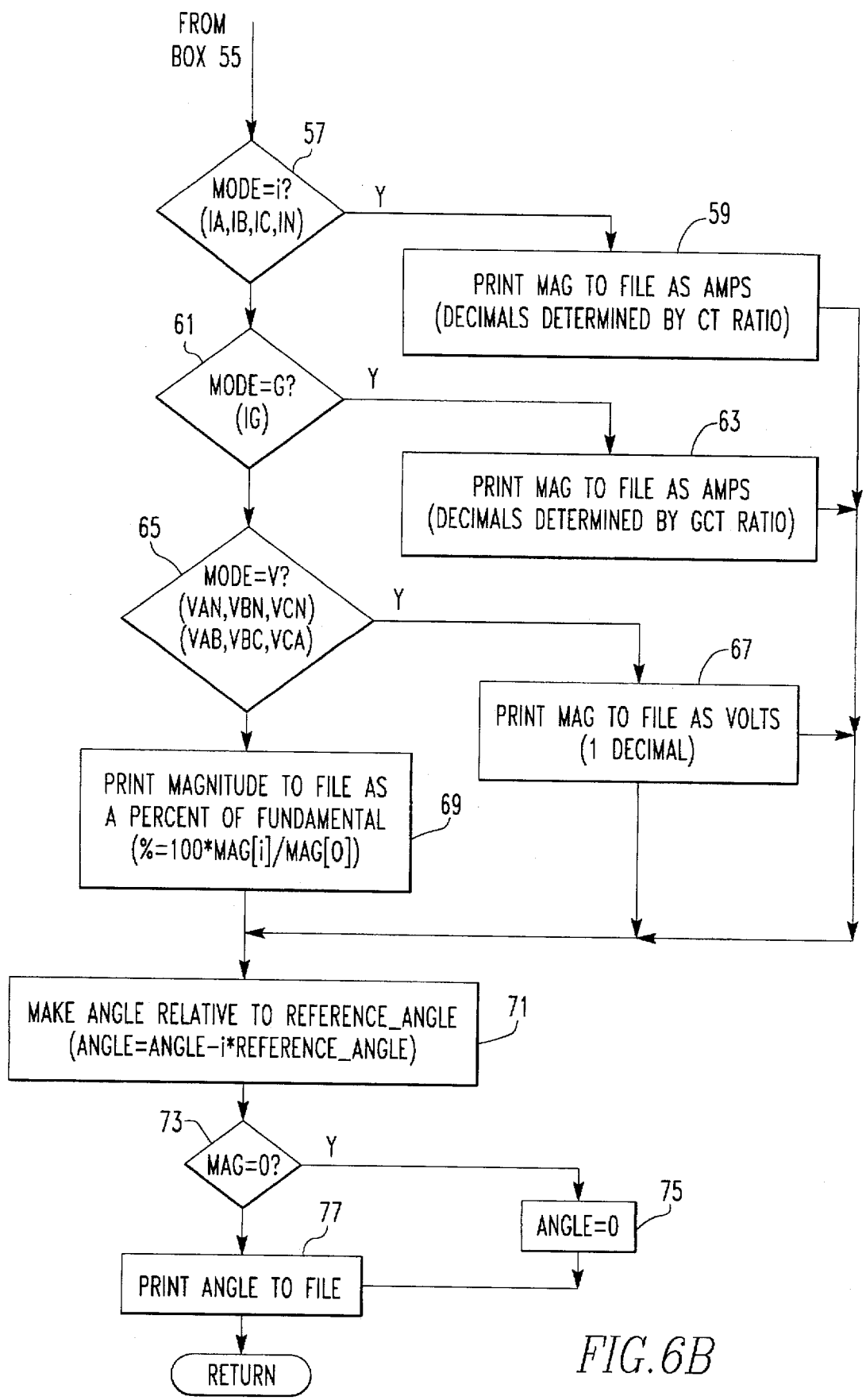

FIGS. 6A and B illustrate a routine for generating display screens such as that illustrated in FIG. 5. Before this routine is called, the user must select a specific signal for harmonic information, i.e., Ia, Ib, Ic, In, Ig, Van, Vbn, Vcn, Vab, Vbc or Vca. In any case a file of fifty lines is constructed, one line per harmonic beginning with the fundamental. The real (sine) and imag (cosine) values have already been generated by the discrete Fourier transform described by Equations 1 and 2 above. The build_harmonic_line (i, mode) routine 47 generates the display such as shown in FIG. 5, for the selected parameter. The index i is the harmonic of the selected parameter. The routine begins at 49 by retrieving the real and imaginary components for the respective harmonics beginning with the fundamental, which is designated the 0 harmonic. The magnitude of the harmonic is computed as well as the phase angle in the manner described above. The filter adjustment is then added to this phase angle to determine the adjusted phase angle. The first time through the routine as determined at 51, the reference phase angle is determined at 53 as that of Van or Vab depending upon whether display of phase-to-neutral or phase-to-phase voltages has been selected. The magnitude and phase angle (adjusted for filtering) for the particular harmonic is then printed to a file at 55. If the selected parameter is a current other than ground current, as determined at 57, the magnitude is printed to the file at 59 in amperes, with the decimal determined by the turns ratio of the current transformers for the phase currents and neutral current. If ground current is the selected parameter as determined at 61, then magnitude is printed to the file as amperes, but the turns ratio for the ground current transformer is used as indicated at 63. If on the other hand, the selected parameter is a voltage as determined at 65, then the magnitude is printed to the file as volts at 67. If the harmonic values have been selected for presentation as a percentage of the fundamental, rather than as a magnitude, the value of the harmonic as a percent of the fundamental is generated at 69. The phase angle relative to the reference angle is then calculated at 71. If the magnitude of the harmonic is 0, as determined at 73 then the phase angle is set equal to 0 at 75. In either case, the angle is printed to the file at 77.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention, which is to be given the full breadth of the claims appended and any and all equivalents thereof.

What is claimed is:

1. Apparatus for use with an ac electrical system comprising:

input means sensing waveforms in said ac electrical systems;

processing means determining values of harmonics in said waveforms sensed by said input means and phase angles between said harmonics and a reference waveform, said processing means including means generating real and imaginary components of said harmonics of said waveforms, determining a ratio of said harmonics with a larger of said components always as a denominator, storing a phase angle table of ratios for angles up to 45° and determining said phase angles from said ratio, said phase angle table and signs of said components.

2. Apparatus for use with an ac electrical system comprising:

input means sensing at least one waveform in said ac electrical system;

processing means determining concurrent values of multiple harmonics in said at least one waveform sensed by said input means and phase angles between said multiple harmonics and a reference waveform;

output means generating an output representing said values of said harmonics and said phase angles; and wherein said processing means includes means generating real and imaginary components of said multiple harmonics of said at least one waveform, determining a ratio of said components with a larger of said components as a denominator, storing a phase angle table of ratios for angles up to 45° and determining said phase angles from said ratio, said phase angle table and signs of said components.

* * * * *